(12) United States Patent
Corisis et al.

(10) Patent No.: US 7,767,913 B2
(45) Date of Patent: Aug. 3, 2010

(54) ELECTRONIC DEVICES INCLUDING CONDUCTIVE VIAS HAVING TWO OR MORE CONDUCTIVE ELEMENTS FOR PROVIDING ELECTRICAL COMMUNICATION BETWEEN TRACES IN DIFFERENT PLANES IN A SUBSTRATE, AND ACCOMPANYING METHODS

(75) Inventors: David J. Corisis, Nampa, ID (US); Lee Choon Kuan, Singapore (SG); Chin Hui Chong, Singapore (SG)

(73) Assignee: Micron Technology, Inc., Boise, ID (US)

( * ) Notice: Subject to any disclaimer, the term of this patent is extended or adjusted under 35 U.S.C. 154(b) by 1013 days.

(21) Appl. No.: 11/359,863

(22) Filed: Feb. 22, 2006

(65) Prior Publication Data

US 2007/0194431 A1 Aug. 23, 2007

(30) Foreign Application Priority Data

Feb. 20, 2006 (SG) .............................. 200601114-2

(51) Int. Cl.
*H01R 12/04* (2006.01)
*H05K 1/11* (2006.01)
(52) U.S. Cl. ..................... 174/262; 174/260; 29/852; 716/13
(58) Field of Classification Search ................. 174/262, 174/260, 261, 255
See application file for complete search history.

(56) References Cited

U.S. PATENT DOCUMENTS

| | | | |
|---|---|---|---|
| 3,739,469 A | 6/1973 | Dougherty, Jr. | |
| 4,522,671 A | 6/1985 | Grünwald et al. | |
| 4,543,715 A | 10/1985 | Iadarola et al. | |
| 4,581,301 A | 4/1986 | Michaelson | |
| 4,614,021 A | 9/1986 | Hulseweh | |
| 4,621,045 A | 11/1986 | Goodner | |
| 5,300,911 A | 4/1994 | Walters | |
| 5,321,207 A | 6/1994 | Huang | |
| 5,374,788 A | 12/1994 | Endoh et al. | |
| 5,381,306 A | 1/1995 | Schumacher et al. | |
| 5,421,083 A | 6/1995 | Suppelsa et al. | |
| 5,541,567 A | 7/1996 | Fogel et al. | |

(Continued)

OTHER PUBLICATIONS

Making Interconnections in Multilayer Boards, IBM Technical Disclosure Bulletin, May 1968, pp. 1985-1986.

(Continued)

*Primary Examiner*—Ishwarbhai B Patel
(74) *Attorney, Agent, or Firm*—TraskBritt

(57) ABSTRACT

Electronic devices include a substrate with first and second pairs of conductive traces extending in or on the substrate. A first conductive interconnecting member extends through a hole in the substrate and communicates electrically with a first trace of each of the first and second pairs, while a second conductive interconnecting member extends through the hole and communicates electrically with the second trace of each of the first and second pairs. The first and second interconnecting members are separated from one another by a distance substantially equal to a distance separating the conductive traces in each pair. Electronic device assemblies include a transmitting device configured to transmit a differential signal through a conductive structure to a receiving device. The conductive structure includes first and second pair of conductive traces with first and second interconnecting members providing electrical communication therebetween.

28 Claims, 10 Drawing Sheets

U.S. PATENT DOCUMENTS

| | | | |
|---|---|---|---|
| 5,619,791 A | 4/1997 | Lambrecht, Jr. et al. | |
| 5,623,160 A | 4/1997 | Liberkowski | |
| 5,689,091 A | 11/1997 | Hamzehdoost et al. | |
| 5,825,084 A | 10/1998 | Lau et al. | |
| 5,949,030 A | 9/1999 | Fasano et al. | |
| 6,091,027 A | 7/2000 | Hesselbom et al. | |
| 6,114,240 A | 9/2000 | Akram et al. | |
| 6,137,064 A | 10/2000 | Kiani et al. | |
| 6,333,560 B1 | 12/2001 | Uzoh | |
| 6,340,822 B1 | 1/2002 | Brown et al. | |
| 6,383,923 B1 | 5/2002 | Brown et al. | |
| 6,388,208 B1 | 5/2002 | Kiani et al. | |
| 6,400,172 B1 | 6/2002 | Akram et al. | |
| 6,479,764 B1 | 11/2002 | Frana et al. | |
| 6,498,381 B2 | 12/2002 | Halahan et al. | |
| 6,528,020 B1 | 3/2003 | Dai et al. | |
| 6,605,551 B2 | 8/2003 | Wermer et al. | |
| 6,628,053 B1 | 9/2003 | Den et al. | |
| 6,673,392 B2 | 1/2004 | Lee et al. | |
| 6,683,472 B2 | 1/2004 | Best et al. | |
| 6,717,071 B2 | 4/2004 | Chang et al. | |
| 6,720,728 B2 | 4/2004 | Den et al. | |
| 6,734,373 B2 | 5/2004 | Seki | |
| 6,787,710 B2 * | 9/2004 | Uematsu et al. | 174/261 |
| 6,829,133 B2 | 12/2004 | Wermer et al. | |
| 6,852,627 B2 | 2/2005 | Sinha et al. | |
| 7,112,525 B1 | 9/2006 | Bhansali et al. | |
| 7,204,018 B2 * | 4/2007 | Kwong et al. | 29/837 |
| 7,317,166 B2 * | 1/2008 | Nakamura | 174/262 |
| 2002/0060361 A1 | 5/2002 | Sasaki | |
| 2002/0100608 A1 | 8/2002 | Fushie et al. | |
| 2003/0211724 A1 | 11/2003 | Haase | |
| 2004/0039859 A1 * | 2/2004 | He et al. | 710/300 |
| 2004/0152240 A1 | 8/2004 | Dangelo | |
| 2004/0201096 A1 | 10/2004 | Iijima et al. | |
| 2004/0251047 A1 | 12/2004 | Bartley et al. | |
| 2005/0133251 A1 * | 6/2005 | Chiu | 174/259 |
| 2005/0269680 A1 | 12/2005 | Hsuan | |
| 2006/0043598 A1 | 3/2006 | Kirby et al. | |

OTHER PUBLICATIONS

Marco Tortonese, "Cantilevers and Tips for Atomic Force Microscopy", IEEE Engineering in Medicine and Biology, Mar./Apr. 1997, pp. 28-33, Park Scientific Instruments, Sunnyvale, CA.

* cited by examiner

ELECTRONIC DEVICES INCLUDING CONDUCTIVE VIAS HAVING TWO OR MORE CONDUCTIVE ELEMENTS FOR PROVIDING ELECTRICAL COMMUNICATION BETWEEN TRACES IN DIFFERENT PLANES IN A SUBSTRATE, AND ACCOMPANYING METHODS

BACKGROUND OF THE INVENTION

1. Field of the Invention

The present invention relates generally to conductive vias for use in circuit boards, semiconductor dice and wafers, interposers, and other substrates. More particularly, the present invention relates to conductive vias that have two or more conductive elements that are spaced substantially the same distance apart from one another as are the conductive traces that electrically communicate with the conductive elements of the via. The present invention also relates to methods for enabling electrical communication between at least two electronic devices using a circuit board using such conductive vias, and to methods for establishing electrical communication between at least two electronic devices through a substrate using such conductive vias.

2. Discussion of Related Art

Circuit boards (often referred to as "printed circuit boards," "wiring boards," or "printed wiring boards") are used in electronic devices to mechanically hold and to provide electrical communication between the electrical components thereof. Electrical components such as transistors, resistors, and capacitors may be soldered into a circuit board and electrically interconnected by electrically conductive signal traces formed within or on the surfaces of the circuit board. Semiconductor chips, semiconductor chip packages, and semiconductor chip modules may be provided that include a number of pins, which may be inserted into corresponding holes in the circuit board and soldered in place. Such chips, packages, and modules may include, for example, microprocessors, dynamic random access memories (DRAMs), static random access memories (SRAMs), and application specific integrated circuits (ASICs), and may each have hundreds or thousands of electrically conductive terminals requiring electrical interconnection with the conductive traces of a circuit board. The electrically conductive traces in the circuit board are used to interconnect the semiconductor chip devices and the electrical components.

Circuit boards generally are substantially planar and include one or more dielectric layers that include an electrically insulating material (such as, for example, ceramic-based materials, polymer-based materials, Bismaleimide Triazine (BT), FR-4 laminates, and FR-5 laminates), and two or more conductive layers. The conductive layers may include a plurality of conductive traces, and each conductive layer may be carried by or disposed between surfaces of the dielectric layers.

The layered structure of the circuit board may include at least one electrically conductive power layer (often referred to as a "voltage supply" layer or plane), at least one electrically conductive ground or bias layer, and one or more electrically conductive signal layers that include electrically conductive traces. For example, one or more signal layers may include conductive traces generally extending in a first direction, and one or more signal layers may include conductive traces generally extending in a second direction that is substantially orthogonal to the first direction. Additional signal layers may also be provided that include conductive traces generally extending at an angle to the conductive traces of the other signal layers.

Other relatively smaller circuit boards may be used in, for example, semiconductor die packages to redistribute the pattern of the bond pads on a semiconductor die attached to a first side of the circuit board to a different pattern of electrical contacts on the same and/or an opposite side of the circuit board. Such circuit boards may also have a layered structure, and the conductive traces may have a custom pattern configured for the particular semiconductor die or package in which they are used.

To provide electrical communication between the electrical devices and components through a circuit board, it may be necessary to provide electrical communication between conductive traces in two or more distinct layers of the circuit board. Electrically conductive vias that extend through the thickness of at least one dielectric layer of the circuit board are typically used to provide electrical communication between the conductive traces of different layers or planes of the circuit board. A conductive via typically includes a hole at least partially penetrating the circuit board. After forming the hole (by drilling, etching, or other known technique), conductive material is provided in the hole. A conductive trace on a first signal layer and a conductive trace on a second, distinct signal layer may each be electrically coupled with the electrically conductive material provided in the via. The conductive traces communicating with one another through the conductive via may be formed or provided on the circuit board either prior or subsequent to forming the conductive via in the circuit board.

Conductive vias also are used to provide electrical paths through many other types of substrates including, for example, semiconductor dice and interposer substrates.

Differential signaling processes may be used in applications requiring extremely high-speed signal transmission and processing. Differential signals are signals that are referenced to each other rather than to ground. As such, differential signaling requires two electrically conductive traces for each electrical signal. The electrically conductive traces are routed together from a driving or transmitting device to a receiving device, which subtracts the two signals from each other to recover the original signal. One trace is used to carry a "true signal phase" and a second trace is used to carry a "complementary signal phase." Furthermore, the conductive traces that carry the true signal phase and the complementary signal phase are typically routed physically close to one another and have the same or substantially the same physical length.

FIG. 1 illustrates a portion of a circuit board 10 that includes a first conductive trace 12 extending to a first conductive via 16, and a second conductive trace 14 extending to a second conductive via 18. As illustrated, the conductive vias 16, 18 may have a diameter $D_0$ (or other cross-sectional dimension) that is greater than a width W of each of the conductive traces 12, 14. As a result, the conductive traces 12, 14 "fan-out" from one another in a region 20 proximate the conductive vias 16, 18. In this configuration, the distance 22 separating the conductive vias 16, 18 differs from the distance 24 separating the conductive traces 12, 14 in all other regions in which they extend parallel to one another. As a result of this increased spacing between the first conductive trace 12 and the second conductive trace 14, a "return path discontinuity" may be provided or generated by the conductive vias 16, 18 when the conductive traces 12, 14 are used to carry differential signals, which may contribute to noise or otherwise degrade the electrical signals carried by the conductive traces 12, 14.

A need exists for conductive vias, structures, and other features that maintain a constant distance between corresponding or complementary conductive paths or traces as they extend from one plane in a substrate to another plane in the substrate.

BRIEF SUMMARY OF THE INVENTION

In one aspect, the present invention includes an electronic device that includes a substantially planar substrate having a hole extending therethrough. A first pair of electrically conductive traces extend substantially parallel to one another on or in the substrate, and a second pair of electrically conductive traces extend substantially parallel to one another on or in the substrate. A first electrically conductive interconnecting member extends through the hole in the substrate and electrically communicates with an end of a first trace of the first pair and an end of a first trace of the second pair. A second electrically conductive interconnecting member also extends through the hole and electrically communicates with an end of a second trace of the first pair and an end of a second trace of the second pair. The first interconnecting member is separated from the second interconnecting member by a distance that is substantially equal to a distance separating the electrically conductive traces of the first pair and a distance separating the electrically conductive traces of the second pair.

In another aspect, the present invention includes an electronic device assembly that includes a transmitting device configured to transmit a differential signal through an electrically conductive structure to a receiving device. The electrically conductive structure includes a first pair of electrically conductive traces that extend substantially parallel to one another in a first plane on or in the substrate and a second pair of electrically conductive traces that extend substantially parallel to one another in a second plane on or in the substrate. A first electrically conductive interconnecting member extends through the hole in the substrate and electrically communicates with an end of a first trace of the first pair and an end of a first trace of the second pair. A second electrically conductive interconnecting member extends through the hole and electrically communicates with an end of a second trace of the first pair and an end of a second trace of the second pair. The first interconnecting member is separated from the second interconnecting member by a distance that is substantially equal to a distance separating the electrically conductive traces of the first pair and a distance separating the electrically conductive traces of the second pair.

The transmitting device is configured to apply a differential signal between the conductive traces of the first pair, between the first interconnecting member and the second interconnecting member, and between the conductive traces of the second pair.

In an additional aspect, the present invention includes a method of fabricating an electronic device assembly. A substantially planar substrate is provided that includes at least one hole extending therethrough. A first pair of electrically conductive traces that extend substantially parallel to one another on or in the substrate is formed, and a second pair of electrically conductive traces that extend substantially parallel to one another on or in the substrate is formed. A first electrically conductive interconnecting member is formed that extends through the hole in the substrate and electrically communicates with an end of a first trace of the first pair and an end of a first trace of the second pair. A second electrically conductive interconnecting member is also formed that extends through the hole and electrically communicates with an end of a second trace of the first pair and an end of a second trace of the second pair. The first interconnecting member is separated from the second interconnecting member by a distance that is substantially equal to a distance separating the electrically conductive traces of the first pair and a distance separating the electrically conductive traces of the second pair.

In yet another aspect, the present invention includes a method of designing an electrical device assembly comprising a transmitting device configured to transmit a differential signal to a receiving device. A substrate is provided that includes at least one hole extending therethrough, and a conductive path is selected that extends from a first location disposed in a plane on or in the substrate to a second location disposed in a second plane on or in the substrate. A portion of the conductive path extends through the hole in the substrate. The electrically conductive traces of a first pair of traces are configured to extend substantially parallel to one another along a portion of the conductive path from the first location to the hole, and the electrically conductive traces of a second pair of traces are configured to extend substantially parallel to one another along another portion of the conductive path from the second location to the hole. A first interconnecting member is configured to extend through the hole and communicate electrically with an end of a first trace of the first pair and an end of a second trace of the second pair, and a second interconnecting member is configured to extend through the hole and communicate electrically with an end of a second trace of the first pair and an end of a second trace of the second pair. The first interconnecting member is separated from the second interconnecting member by a distance that is substantially equal to the distance separating the conductive traces of the first pair from one another and the conductive traces of the second pair from one another.

The features, advantages, and additional aspects of the present invention will be apparent to those skilled in the art from a consideration of the following detailed description taken in combination with the accompanying drawings.

BRIEF DESCRIPTION OF THE DRAWINGS

While the specification concludes with claims particularly pointing out and distinctly claiming that which is regarded as the present invention, the features and advantages of the various aspects of the present invention can be more readily ascertained from the following description of the invention when read in conjunction with the accompanying drawings, in which:

DETAILED DESCRIPTION OF THE ILLUSTRATED EMBODIMENTS

Figure 1:
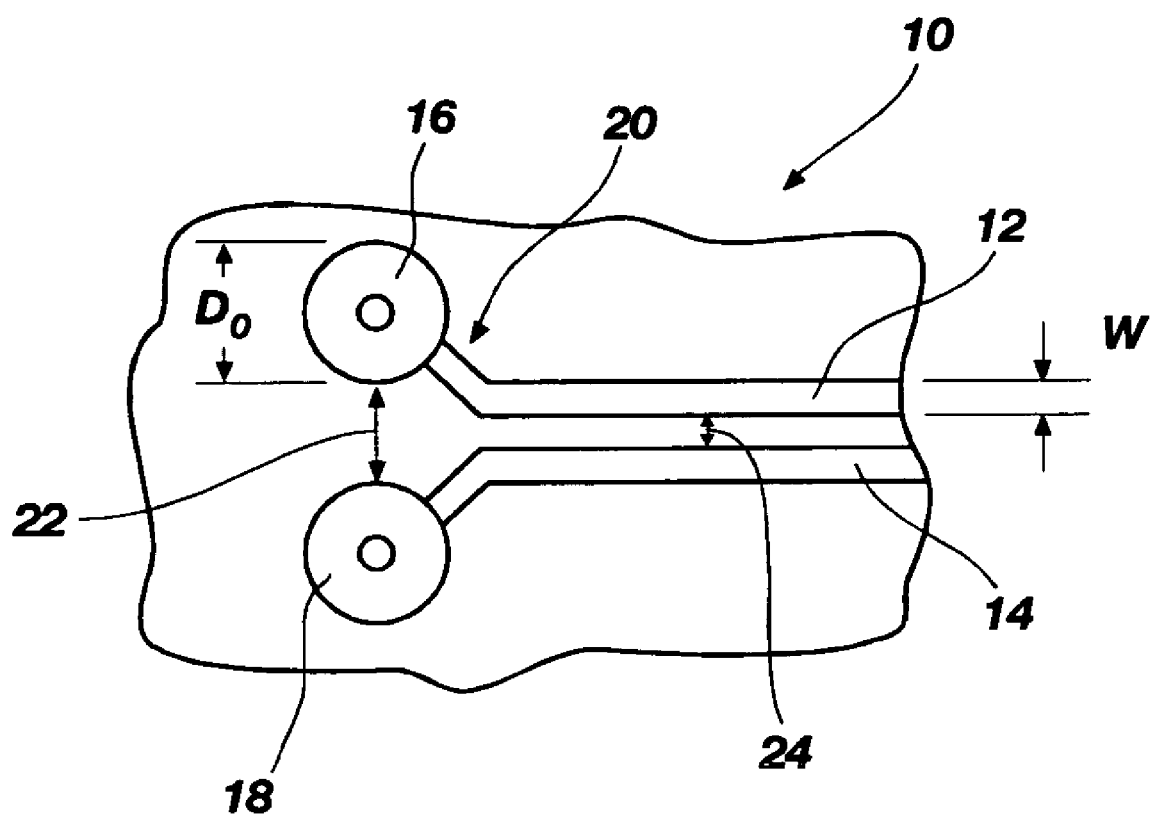
FIG. 1 is a plan view of a portion of a circuit board showing conductive traces and vias.

In the description which follows, like features and elements have been identified by the same or similar reference numerals for ease of identification and enhanced understanding of the disclosure hereof. Such identification is by way of convenience for the reader only, however, and is not limiting of the present invention or an implication that features and elements of various components and embodiments identified by like reference numerals are identical or constrained to identical functions.

Figure 2:
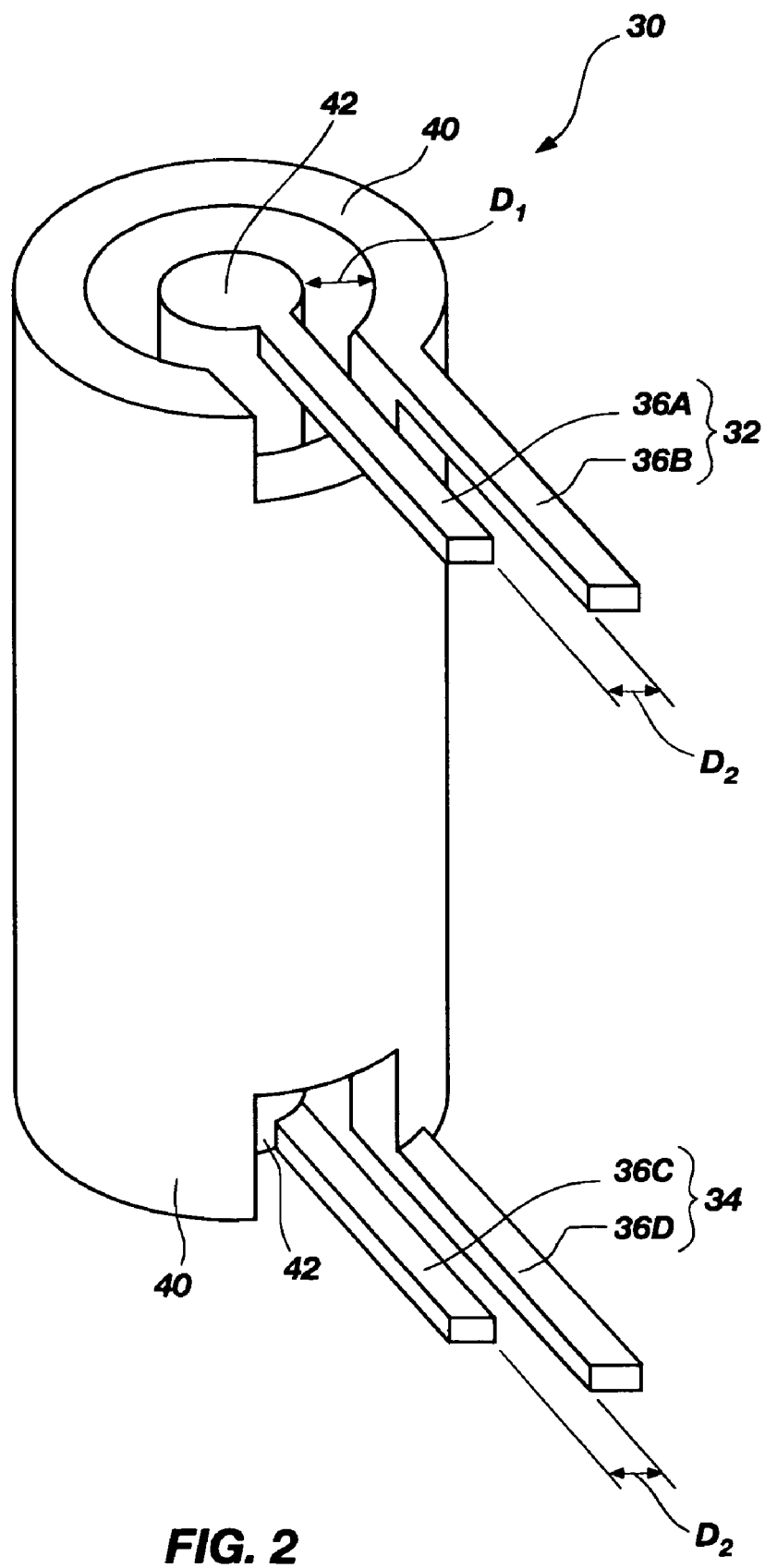
FIG. 2 is a perspective view of an illustrative conductive structure that embodies teachings of the present invention.

An illustrative conductive structure 30 that embodies teachings of the present invention is shown in FIG. 2. One or more conductive structures 30 may be carried by a substrate to provide an electronic device that embodies teachings of the present invention. By way of example and not limitation, substrates in which one or more conductive structures 30 may be provided include circuit boards such as, for example, relatively larger motherboards in computer systems or relatively smaller circuit board substrates or interposers in semiconductor device packages. Other substrates in which one or more conductive structures 30 may be provided include semiconductor dice, full or partial semiconductor wafers, silicon-on-insulator (SOI) type substrates (e.g., silicon-on-glass (SOG), silicon-on-ceramic (SOC), silicon-on-sapphire (SOS), etc.), or any substantially planar substrate that is substantially comprised of an electrically insulating material and configured to carry electrical traces for providing electrical communication between two or more electrical devices. For simplicity and to facilitate illustration, the conductive structure 30 is shown in FIG. 2 without the substrate in which it may be provided.

The conductive structure 30 may include a first pair 32 of electrically conductive traces 36A, 36B and a second pair 34 of electrically conductive traces 36C, 36D. The electrically conductive traces 36A, 36B of the first pair 32 may extend substantially parallel to one another in or along a first plane, and the electrically conductive traces 36C, 36D of the second pair 34 may extend substantially parallel to one another in or along a second plane. The second plane may be oriented substantially parallel to the first plane and separated therefrom by a distance. Only a portion of each of the conductive traces 36A, 36B, 36C, 36D is shown in FIG. 2, and it is understood that each conductive trace 36A, 36B, 36C, 36D may extend on, in, and/or through a substrate (not shown) to an electronic component or device (not shown) to which the conductive trace 36A, 36B, 36C, 36D is electrically connected.

The conductive structure 30 may further include a first interconnecting member 40 and a second interconnecting member 42, each of which may be electrically conductive. The first interconnecting member 40 may extend between and provide electrical communication between a second conductive trace 36B of the first pair 32 and a second conductive trace 36D of the second pair 34. Similarly, the second interconnecting member 42 may extend between and provide electrical communication between a first conductive trace 36A of the first pair 32 and a first conductive trace 36C of the second pair 34. Furthermore, the first interconnecting member 40 may at least partially surround the second interconnecting member 42.

The second interconnecting member 42 may be separated apart from the first interconnecting member 40 by a distance $D_1$. Substantial portions of the adjacent surfaces of the first interconnecting member 40 and the second interconnecting member 42 may be uniformly separated from one another by the distance $D_1$. The electrically conductive traces 36A, 36B of the first pair 32 may be separated apart from one another over their respective lengths by a distance $D_2$. Similarly, the electrically conductive traces 36C, 36D of the second pair 34 may be separated from one another over their respective lengths by the same distance $D_2$. By providing a conductive structure 30 as shown in FIG. 2, the distance $D_1$ separating the second interconnecting member 42 from the first interconnecting member 40 may be equal to or substantially equal to the distance $D_2$ separating the conductive traces 36A, 36B of the first pair 32 and the conductive traces 36C, 36D of the second pair 34. In this configuration, the conductive traces 36A, 36B of the first pair 32 and the conductive traces 36C, 36D of the second pair 34 may be configured to carry differential signals. By interconnecting the traces 36A, 36B of the first pair 32 with the conductive traces 36C, 36D of the second pair 34 using the first interconnecting member 40 and the second interconnecting member 42, return path discontinuities may be minimized, improving the quality of the electrical signals carried by the conductive traces.

In one particular embodiment of the invention, the first interconnecting member 40 and the second interconnecting member 42 may be substantially coaxially arranged. For example, the first interconnecting member 40 may have a substantially hollow cylindrical shape, and the second interconnecting member 42 may have a generally solid cylindrical shape, as shown in FIG. 2. The second interconnecting member 42 may be disposed within the first interconnecting member 40. In this configuration, the second interconnecting member 42 may have an outer diameter, and the first interconnecting member 40 may have an inner diameter, and the distance $D_1$ may be equal to one-half the difference between the outer diameter of the second interconnecting member 42 and the inner diameter of the first interconnecting member 40.

By way of example only and not limitation, each conductive trace 36A, 36B, 36C, 36D may have a thickness and width that are each less than about 50 microns. Furthermore, the distance $D_1$ and the distance $D_2$ may each be less than about 50 microns. More particularly, the distance $D_1$ and the distance $D_2$ may each be less than about 30 microns. By way of example and not limitation, the second interconnecting member 42 may have an outer diameter in a range from about 20 microns to about 150 microns, and the first interconnecting member 40 may have an inner diameter in a range from about 30 microns to about 200 microns. More particularly, the second interconnecting member 42 may have an outer diameter in a range from about 100 microns to about 150 microns, and the first interconnecting member 40 may have an inner diameter in a range from about 130 microns to about 180 microns. Furthermore, the first interconnecting member 40 may have an outer diameter in a range from about 80 microns to about 310 microns. More particularly, the first interconnecting member 40 may have an outer diameter in a range from about 260 microns to about 310 microns.

In other embodiments, the first interconnecting member 40 and the second interconnecting member 42 may each have a substantially hollow, generally cylindrical shape. Furthermore, the first interconnecting member 40 and the second interconnecting member 42 may have three-dimensional shapes such that the two-dimensional cross-sections thereof have shapes other than substantially circular. For example, the first interconnecting member 40 and the second interconnecting member 42 may have three-dimensional shapes such that the two-dimensional cross-sections thereof have shapes that are elliptical, triangular, rectangular, etc.

Figure 3:
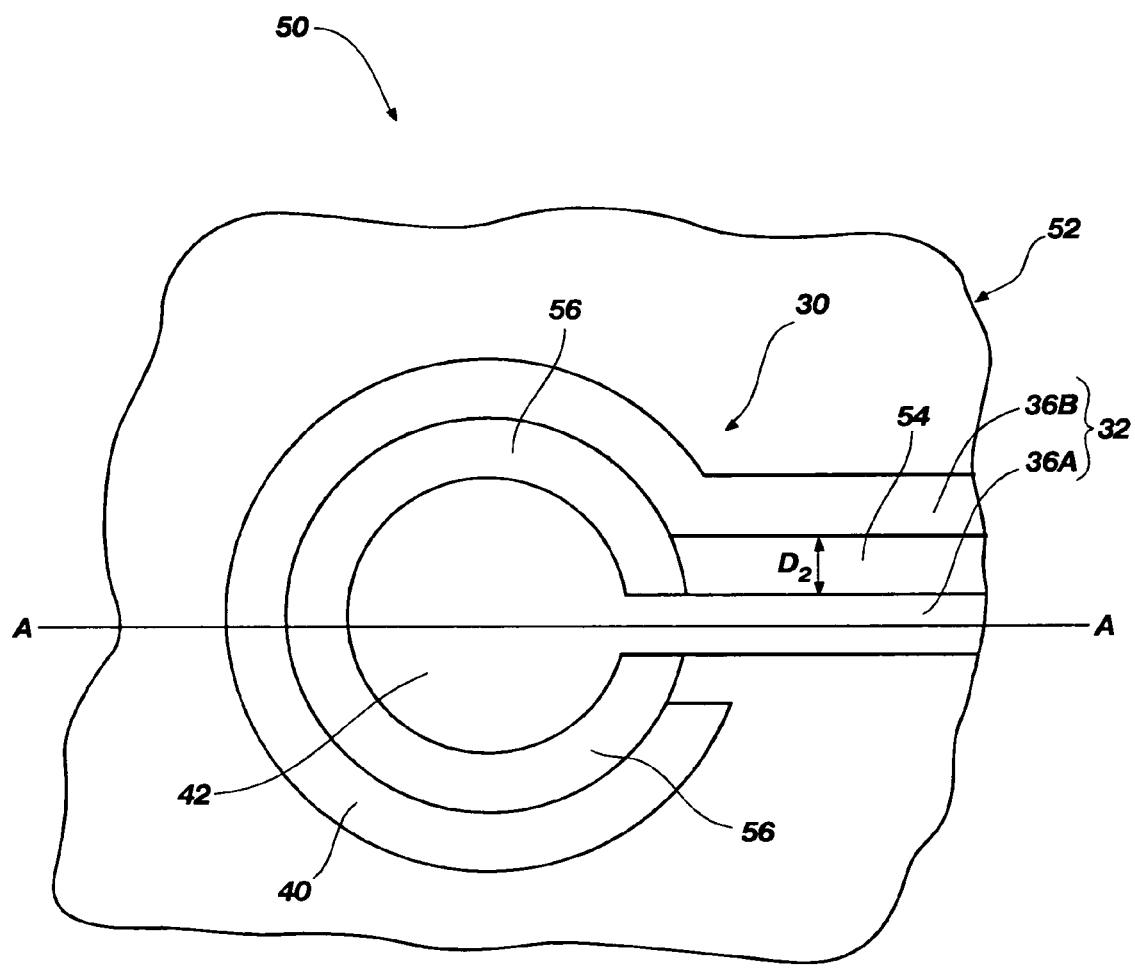
FIG. 3 is a partial top plan view of an illustrative electronic device that embodies teachings of the present invention.

A top plan view of a portion of an illustrative electronic device 50 that includes at least one conductive structure 30 and that embodies teachings of the present invention is shown in FIG. 3. The electronic device 50 may include a substrate 52 that carries the conductive structure 30. The substrate 52 may be or may include any of those previously described in relation to FIG. 2. As shown in FIG. 3, the conductive traces 36A, 36B of the first pair 32 may be carried by an exterior surface of the substrate 52. Alternatively, the conductive traces 36A, 36B of the first pair 32 may be carried internally within the substrate 52, or they may include one or more segments carried by an exterior surface of the substrate 52 and one or more segments carried internally within the substrate 52. Furthermore, the substrate 52 may include a plurality of layers, and the conductive traces 36A, 36B of the first pair 32 may be carried by external or internal surfaces of the layers of the substrate 52. Similarly, the conductive traces 36C, 36D of the second pair 34 may also be located externally or internally relative to the substrate 52 as previously described in relation to the conductive traces 36A, 36B of the first pair 32.

The substrate 52 may be substantially planar, and the first interconnecting member 40 and the second interconnecting member 42 may extend at least partially through the substrate 52 so as to connect ends of the conductive traces 36A, 36B with ends of the conductive traces 36C, 36D. The conductive traces 36A, 36B may be disposed in a first plane, and the conductive traces 36C, 36D may be disposed in a second, different plane. In the depicted example, interconnecting members 40, 42 extend substantially through the thickness of substrate 52 and are oriented in a direction substantially normal to the major surfaces of the substrate 52.

A dielectric material 54 may be provided on or in the substrate 52 between the conductive traces 36A, 36B of the first pair 32 and between the conductive traces 36C, 36D of the second pair 34 (FIG. 2). For example, the dielectric material 54 may include a polymer material such as, for example, a thermoplastic material, an epoxy, or an epoxy-based material. Commercially available dielectric solder-resist materials may also be used as the dielectric material 54. A dielectric material 56 may be provided between the first interconnecting member 40 and the second interconnecting member 42. The dielectric material 56 may be the same as or different from the dielectric material 54.

The capacitance exhibited between the conductive traces 36A, 36B of the first pair 32 and between the conductive traces 36C, 36D of the second pair 34 may be at least partially a function of the size and shape of the conductive traces 36C, 36D, the distance $D_2$ separating the conductive traces, and the dielectric constant exhibited by the dielectric material 54. Similarly, the capacitance exhibited between the first interconnecting member 40 and the second interconnecting member 42 may be at least partially a function of the size and shape of the first interconnecting member 40 and the second interconnecting member 42, the distance $D_1$ separating the first interconnecting member 40 and the second interconnecting member 42, and the dielectric constant exhibited by the dielectric material 56.

In one embodiment, the dielectric material 56 may be selected to exhibit a dielectric constant that differs from a dielectric constant exhibited by the dielectric material 54. If the interconnecting members 40, 42 are relatively larger than the conductive traces 36A, 36B, 36C, 36D, the capacitance exhibited between the interconnecting members 40, 42 may be larger than the capacitance exhibited between the first pair 32 of conductive traces 36A, 36B and the capacitance exhibited between the second pair 34 of conductive traces 36C, 36D. As such, the dielectric material 56 and the dielectric material 54 may be selected such that the capacitance exhibited between the first interconnecting member 40 and the second interconnecting member 42 is similar or equal to a capacitance exhibited between the conductive traces 36A, 36B of the first pair 32 and a capacitance exhibited between the conductive traces 36C, 36D of the second pair 34. For example, the dielectric material 56 may exhibit a dielectric constant that is less than a dielectric constant exhibited by the dielectric material 54. In this manner, return path discontinuities may be further minimized, thereby further improving the quality of the electrical signals carried by the conductive traces.

In other embodiments, the dielectric material 56 may be the same as the dielectric material 54, and the size and shape of each of the interconnecting members 40, 42 and the conductive traces 36A, 36B, 36C, 36D may be configured to minimize or eliminate differences in the respective capacitances exhibited by the interconnecting members 40, 42, the first pair 32 of conductive traces 36A, 36B, and the second pair 34 of conductive traces 36C, 36D. Furthermore, combinations of the techniques described above may be used to minimize or eliminate differences in capacitance. For example, the dielectric material 56 and the dielectric material 54 may be selected to exhibit different known or predetermined dielectric constants, and the size and shape of each of the interconnecting members 40, 42 and the conductive traces 36A, 36B, 36C, 36D may be configured to minimize or eliminate differences in the respective capacitances exhibited by the interconnecting members 40, 42, the first pair 32 of conductive traces 36A, 36B, and the second pair 34 of conductive traces 36C, 36D considering the known or predetermined dielectric constants exhibited by the dielectric material 56 and the dielectric material 54.

Figure 4A:
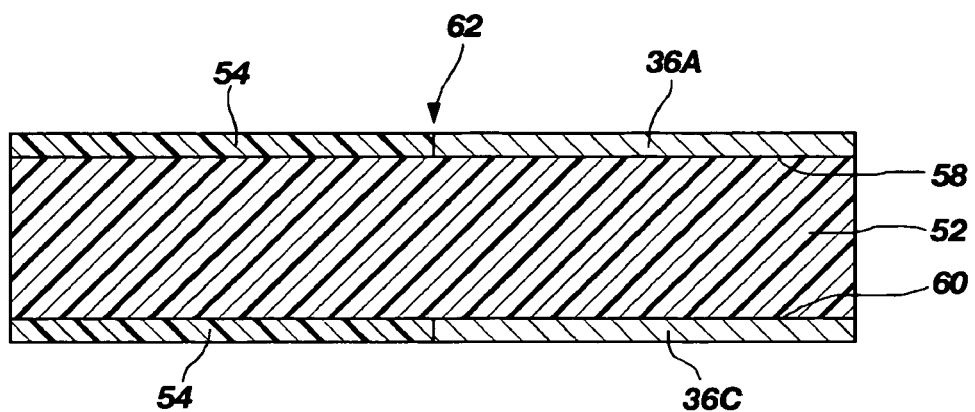
FIGS. 4A-4I illustrate a representative method of manufacturing the electronic device shown in FIG. 3.

An illustrative method of fabricating the electronic device 50 shown in FIG. 3 is described below with reference to FIGS. 4A-4I. FIGS. 4A-4I illustrate incremental points in an illustrative method of fabricating the electronic device 50 shown in FIG. 3, taken along section line A-A shown therein. Referring first to FIG. 4A, a substrate 52 such as, for example, a circuit board, semiconductor die, or semiconductor wafer may be provided that includes at least the conductive traces 36A, 36B of the first pair 32 and between the conductive traces 36C, 36D of the second pair 34. In the cross-sectional views shown in FIGS. 4A-4I, only the first conductive trace 36A of the first pair 32 and the first trace 36C of the second pair 34 are visible. The conductive traces 36A, 36B of the first pair 32 and the conductive traces 36C, 36D of the second pair 34 may extend to a general location 62 on the substrate 52 at which it is desired to interconnect the conductive traces 36A, 36B of the first pair 32 and the conductive traces 36C, 36D of the second pair 34 through the substrate 52.

By way of example and not limitation, the conductive traces 36A, 36B of the first pair 32 and between the conductive traces 36C, 36D of the second pair 34 may be formed on or in the substrate 52 by, for example, depositing a thin layer of conductive material (such as, for example, metals and metal alloys including one or more of gold, copper, aluminum, silver) and patterning the conductive traces 36A, 36B, 36C, 36D in the thin layer of conductive material by, for example, masking and etching (wet or dry) the thin layer of conductive material. Such a thin layer of conductive material may be deposited by, for example, physical vapor deposition (PVD) techniques (e.g., sputtering), chemical vapor deposition (CVD) techniques, electroplating techniques, electroless plating techniques, etc. Alternatively, a conductive film may be laminated to both sides of the substrate 52. The conductive film may include preformed conductive traces 36A, 36B, 36C, 36D, or the conductive traces 36A, 36B, 36C, 36D may be subsequently formed or patterned in the conductive film.

In the example shown in FIG. 4A, the conductive traces 36A, 36B of the first pair 32 may be carried by a first major surface 58 of the substrate 52 and the conductive traces 36C, 36D of the second pair 34 may be carried by a second, opposite major surface 60 of the substrate 52.

A dielectric material 54 optionally may be provided on the first major surface 58 and the second major surface 60 of the substrate 52, including the areas between the conductive traces 36A, 36B, 36C, 36D.

Figure 4B:
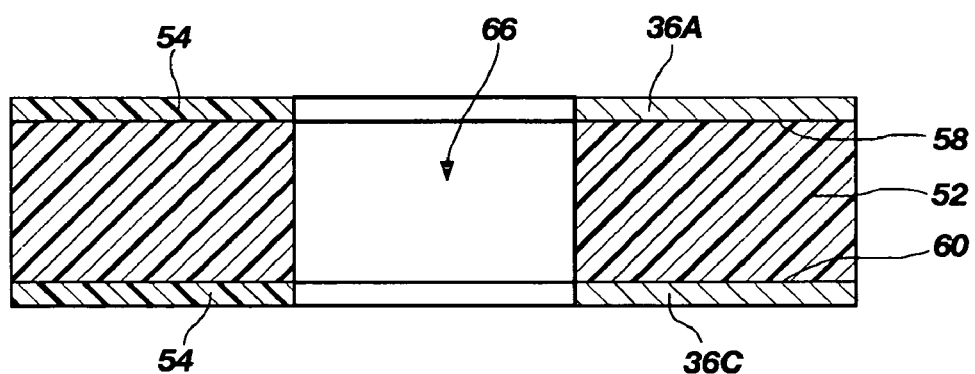

As shown in FIG. 4B, a hole or aperture 66 may be punched, drilled, etched, or otherwise formed through the substrate 52 from the first major surface 58 to the second major surface 60. For example, a laser may be used to ablate the material of the substrate 52 to form the aperture 66 through the substrate 52. Mechanical punching and drilling processes or chemical etching processes may also be used, as may combinations of processes, to form and shape the aperture 66 through the substrate 52. The aperture 66 may communicate with ends of each conductive trace 36A, 36B of a first pair 32 and with ends of each conductive trace 36C, 36D of a second pair 34 (FIG. 2). In some embodiments, the aperture 66 may be formed subsequent to formation of the conductive traces 36A, 36B, 36C, 36D. In other embodiments, however, the aperture 66 may be formed prior to formation of the conductive traces 36A, 36B, 36C, 36D.

Figure 4C:
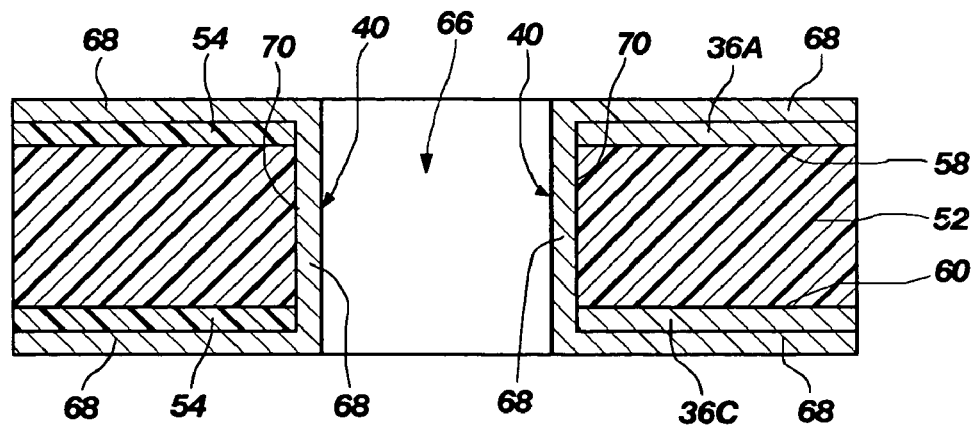

Referring to FIG. 4C, a first interconnecting member 40 may be formed by depositing a layer of conductive material 68 at least over the exposed lateral surfaces 70 of the substrate 52 within the aperture 66. By way of example and not limitation, the layer of conductive material 68 may be deposited over all exposed surfaces of the structure, including the exposed lateral surfaces 70 of the substrate 52 within the aperture 66, using, for example, electroplating techniques, electroless plating techniques, or physical vapor deposition techniques to form the structure shown in FIG. 4C.

Figure 4D:
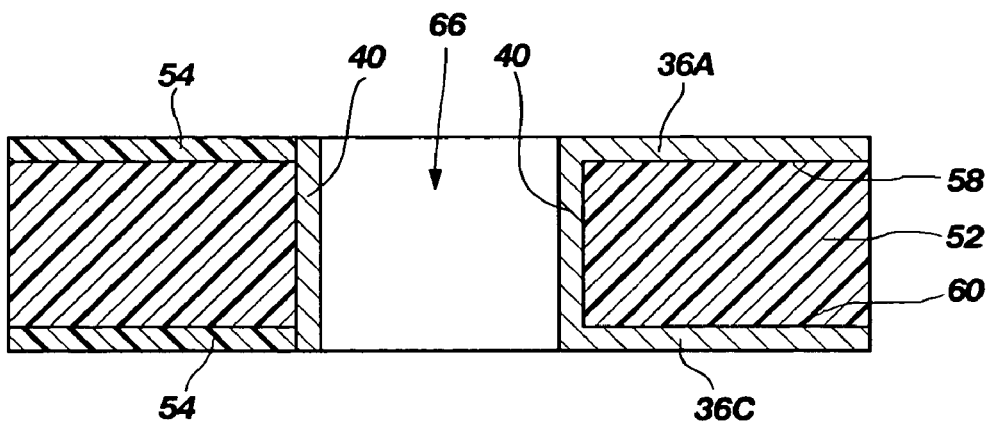

The layer of conductive material 68 may be selectively patterned to remove the unwanted areas of the layer of conductive material 68 deposited on surfaces outside the aperture 66 and form the structure shown in FIG. 4D. In some embodiments, unwanted areas of the layer of conductive material 68 deposited on surfaces inside the aperture 66 may also be selectively patterned and removed. The layer of conductive material 68 may be selectively patterned by, for example, masking and etching (wet or dry) the layer of conductive material 68. As seen in FIG. 4D, if the conductive traces 36A, 36B, 36C, 36D have been previously formed, the first interconnecting member 40 may be structurally and electrically coupled to both of the conductive traces 36A, 36B of the first pair 32 and to both of the conductive traces 36C, 36D of the second pair 34 upon formation of the first interconnecting member 40.

Figure 4E:
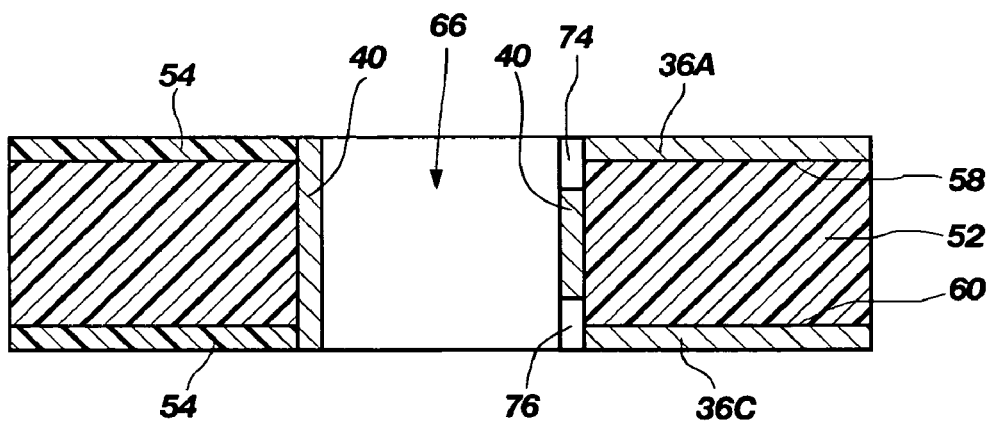

Referring to FIG. 4E, a first aperture, groove, void, or notch 74 may be formed in the first interconnecting member 40 so that the first conductive trace 36A of the first pair 32 may be electrically isolated from the first interconnecting member 40, and a second aperture, groove, void, or notch 76 may be formed in the first interconnecting member 40 so that the first conductive trace 36C of the second pair 34 may be electrically isolated from the first interconnecting member 40. By way of example and not limitation, the first notch 74 and the second notch 76 may be formed by etching (wet or dry) the first interconnecting member 40 through a mask. Other methods such as, for example, electron beam lithography may also be used to form the first notch 74 and the second notch 76 in the first interconnecting member 40. If the conductive traces 36A, 36B, 36C, 36D have been previously formed, the second conductive trace 36B of the first pair 32 and the second conductive trace 36D of the second pair 34 (FIG. 2) may remain structurally and electrically coupled to the first interconnecting member 40. As previously discussed, however, in some embodiments the conductive traces 36A, 36B, 36C, 36D may be formed subsequent to formation of the first interconnecting member 40 and the second interconnecting member 42.

In some embodiments, the first notch 74 and the second notch 76 may be formed at the same time the layer of conductive material 68 is selectively patterned to remove the unwanted areas of the layer of conductive material 68 deposited on surfaces outside the aperture 66, as previously discussed.

Figure 4F:
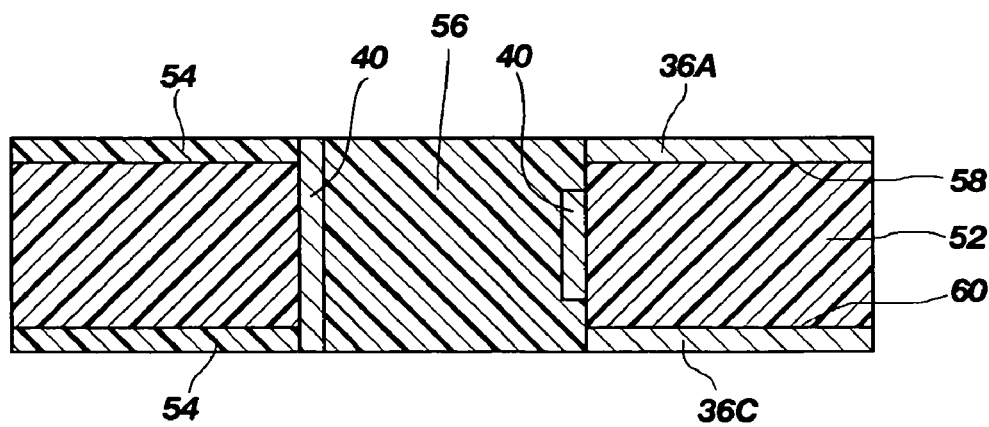

The aperture 66, the first notch 74, and the second notch 76 may be filled with dielectric material 56 to form the structure shown in FIG. 4F. By way of example and not limitation, a curable fluid polymer material such as, for example, an epoxy or epoxy-based material may be provided within the aperture 66, the first notch 74, and the second notch 76 and subsequently consolidated or cured to form a substantially rigid structure comprising the dielectric material 56. As an alternate method, a curable polymer material may be provided within the aperture 66, the first notch 74, and the second notch 76 and subsequently consolidated or cured using programmed material consolidation techniques such as, for example, photolithography techniques. In such techniques, multiple layers or regions of consolidated material may be sequentially formed within the aperture 66, the first notch 74, and the second notch 76 using an at least partially automated machine.

In some embodiments of the present invention, a curable fluid polymer material such as, for example, an epoxy or epoxy-based material may be blanket deposited over the substrate 52 including within the aperture 66, the first notch 74, and the second notch 76 and subsequently selectively consolidated or cured only at selected regions such as in the aperture 66, the notches 74, 76, and/or between the first pair 32 of conductive traces 36A, 36B and between the second pair 34 of conductive traces 36C, 36D. The regions of curable fluid polymer material that have not been consolidated or cured then may be washed or rinsed away. If the substantially rigid structure comprising the dielectric material 56 is not selectively provided within aperture 66, the notches 74, 76, and/or between the first pair 32 of conductive traces 36A, 36B and between the second pair 34 of conductive traces 36C, 36D, the structure optionally may be planarized to remove unwanted regions of dielectric material disposed outside the aperture 66 using, for example, known etching or chemical mechanical polishing (CMP) techniques.

In some embodiments of the present invention, the dielectric material 54 may be identical to the dielectric material 56, and may be simultaneously deposited onto the substrate 52 after forming the aperture 66.

Figure 4G:
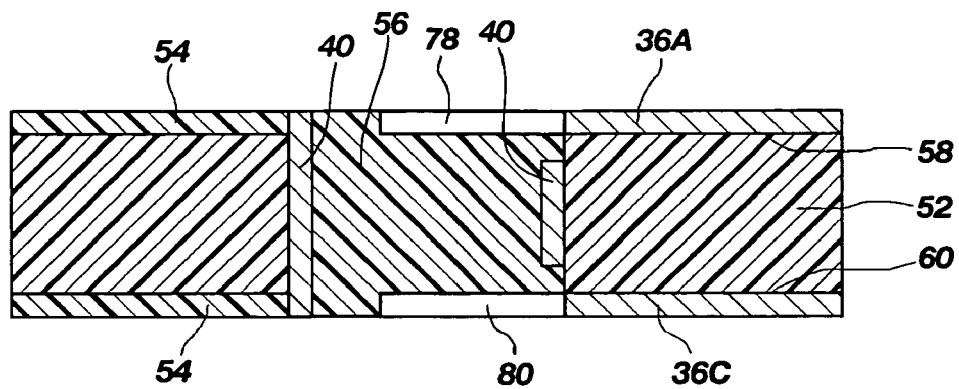

Referring to FIG. 4G, a first aperture, groove, void, or notch 78 may be formed in the dielectric material 56 that extends from an end of the conductive trace 36A to a location in the dielectric material 56 at which the second interconnecting member 42 (FIG. 2) is to be formed, and a second aperture, groove, void, or notch 80 may be formed in the dielectric material 56 that extends from an end of the conductive trace 36C to a location in the dielectric material 56 at which the second interconnecting member 42 (FIG. 2) is to be formed. By way of example and not limitation, the first notch 78 and the second notch 80 may be formed by etching (wet or dry) the dielectric material 56 through a mask. Other methods such as, for example, electron beam lithography may also be used to form the first notch 78 and the second notch 80 in the dielectric material 56. Furthermore, if the dielectric material 56 is provided in or on the substrate in a liquid form and subsequently consolidated or cured using a selective consolidation technique as previously described, the first notch 78 and the second notch 80 may be formed in the dielectric material 56 when the dielectric material 56 is selectively consolidated by failing to consolidate dielectric material 56 in the regions at which the first notch 78 and the second notch 80 are to be formed.

Figure 4H:
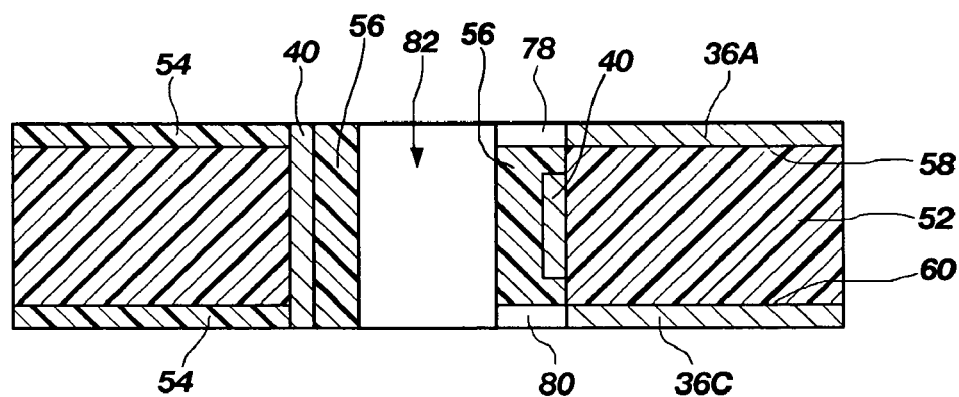

As shown in FIG. 4H, an additional hole or aperture 82 may be punched, drilled, etched, or otherwise formed through the dielectric material 56, as previously described in relation to the aperture 66 shown in FIG. 4B. Similar to the notches 78, 80 in the dielectric material 56, if the dielectric material 56 is provided in or on the substrate 52 in a liquid form and subsequently consolidated or cured using a selective consolidation technique as previously described, the additional hole or aperture 82 shown in FIG. 4H may be formed in the dielectric material 56 when the dielectric material 56 is selectively consolidated by failing to consolidate dielectric material 56 in the region at which the additional hole or aperture 82 is to be formed.

Figure 4I:
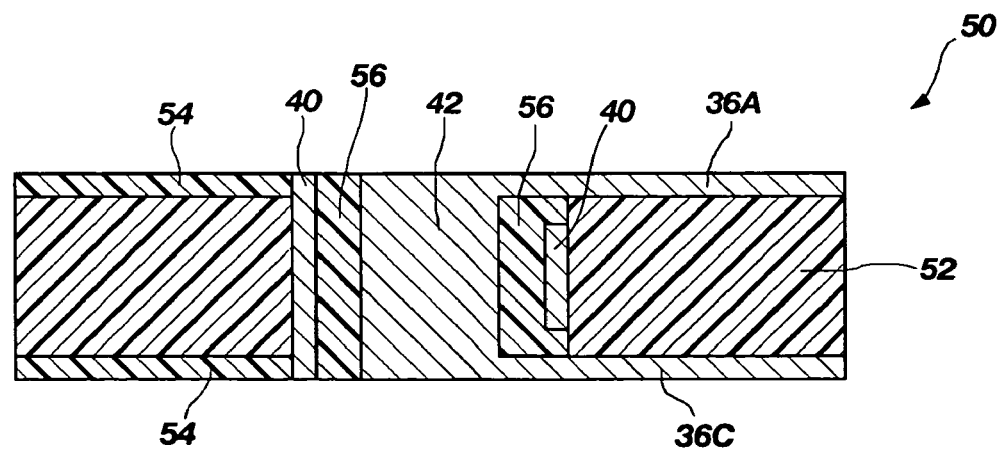

The aperture 82, the first notch 78, and the second notch 80 in the dielectric material 56 then may be filled with an electrically conductive material to form the second interconnecting member 42, and the final electronic device 50, as shown in FIG. 4I. By way of example and not limitation, the aperture 82, the first notch 78, and the second notch 80 in the dielectric material 56 may be filled with an electrically conductive material using, for example, electroplating techniques, electroless plating techniques, or physical vapor deposition techniques. Any excess conductive material deposited on the structure may be removed by, for example, masking and etching the structure as previously described herein.

It is understood that other methods, sequences, or processing methods may be used to form the final electronic device 50 shown in FIGS. 3 and 4I. For example, in one additional method according to the invention, the aperture 82 shown in FIG. 4H may be formed through the dielectric material 56 prior to forming the first notch 78 and the second notch 80 in the dielectric material, as previously described in relation to FIG. 4G. In yet another additional method, instead of filling the entire aperture 66 shown in FIG. 4E with dielectric material 56 as described above in relation to FIG. 4F and subsequently forming another aperture 82 through the dielectric material 56 as described above in relation to FIG. 4H, a relatively thin layer of dielectric material 56 may be deposited on the lateral surfaces of the first interconnecting member 40 within the aperture 66 (FIG. 4E) using an electrocoating process, such as that described in U.S. Pat. No. 6,829,133 to Wermer et al., the disclosure of which is hereby incorporated herein in its entirety by this reference. In this method, there may be no need to form an additional aperture 82 through the dielectric material 56.

In the conductive structure 30 shown in FIG. 2, and the electronic device 50 shown in FIGS. 3 and 4I, which includes the conductive structure 30, the conductive traces 36A, 36B of the first pair 32 and the conductive traces 36C, 36D of the second pair 34 are shown extending away from the first interconnecting member 40 and the second interconnecting member 42 in substantially the same direction on opposite sides of the substrate 52.

Figure 5:
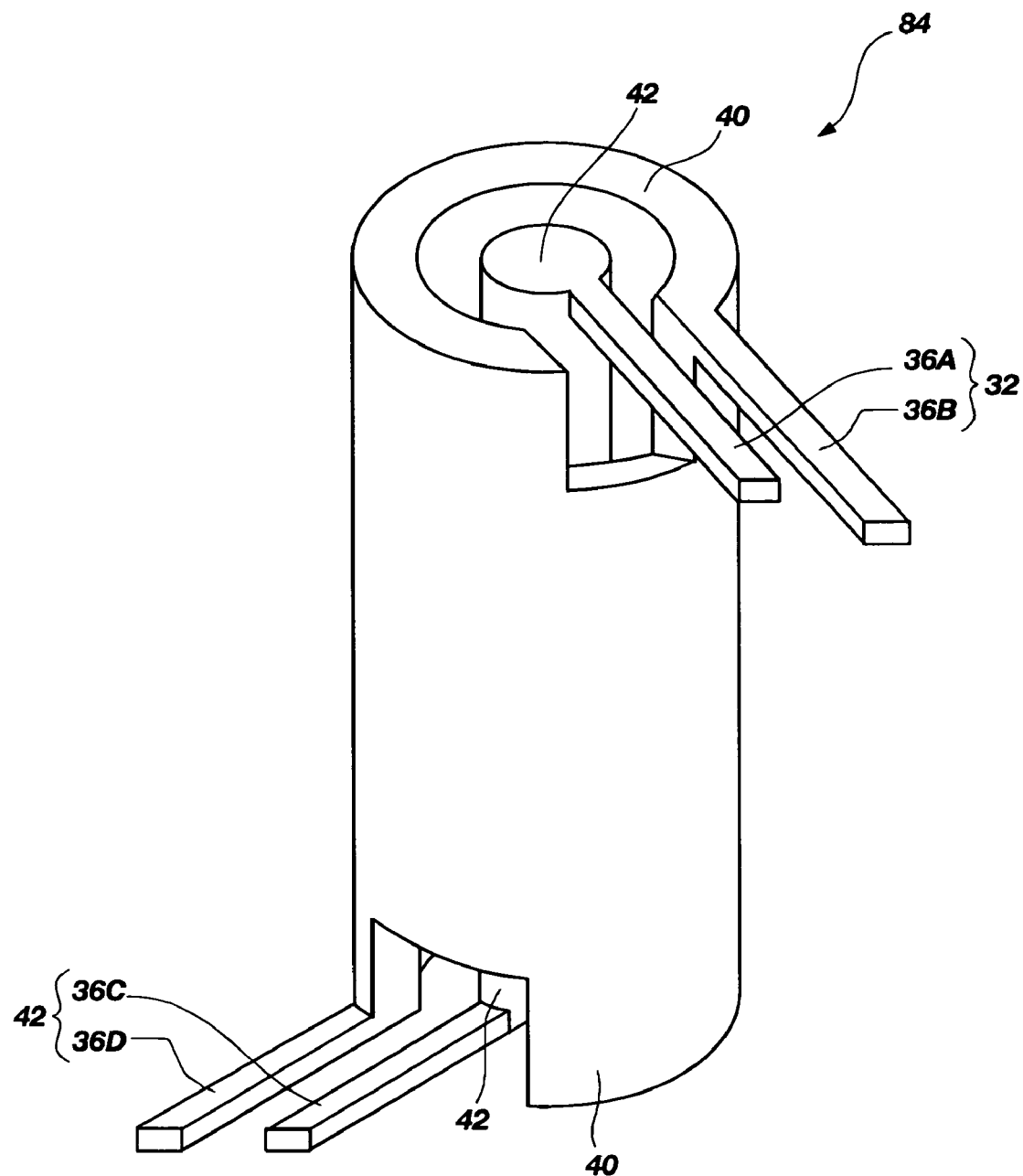
FIG. 5 is a perspective view of another illustrative conductive structure that embodies teachings of the present invention.

Another illustrative conductive structure 84 that embodies teachings of the present invention is shown in FIG. 5. The conductive structure 84 is similar to the conductive structure 30 and includes a first pair 32 of electrically conductive traces 36A, 36B, a second pair 34 of electrically conductive traces 36C, 36D, a first interconnecting member 40, and a second interconnecting member 42. In the conductive structure 84, however, the electrically conductive traces 36A, 36B of the first pair 32 extend away from the first interconnecting member 40 and the second interconnecting member 42 in a direction that is oriented at an angle relative to a direction in which the electrically conductive traces 36C, 36D of the second pair 34 extend away from the first interconnecting member 40 and the second interconnecting member 42. The angle between the directions in which the conductive traces 36A, 36B of the first pair 32 and the conductive traces 36C, 36D of the second pair 34 extend away from the first interconnecting member 40 and the second interconnecting member 42 may be any angle between 0 degrees and 360 degrees.

Figure 6:
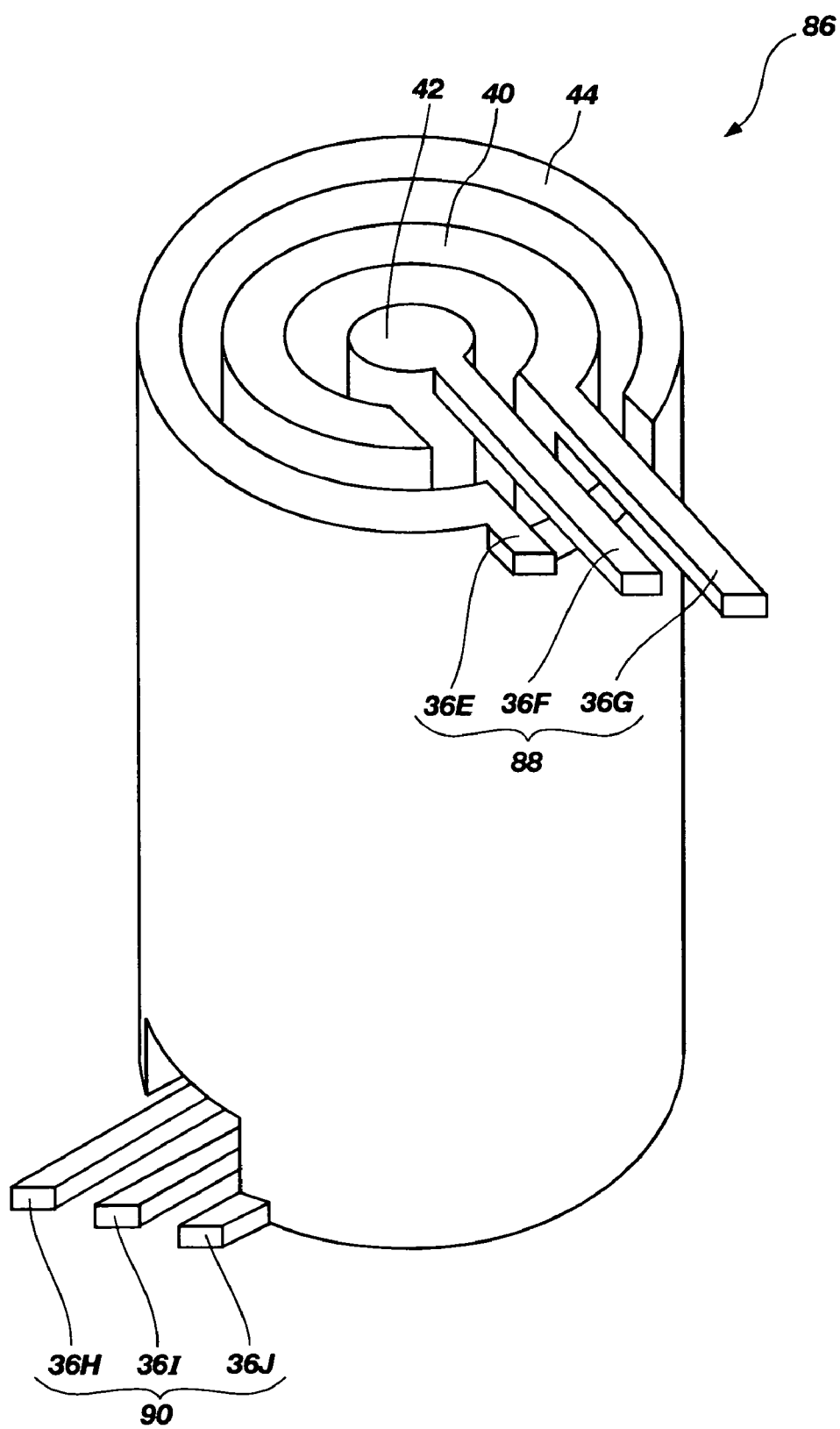
FIG. 6 is a perspective view of yet another illustrative conductive structure that embodies teachings of the present invention.

Conductive structures that embody teachings of the present invention may include more than two conductive traces and corresponding interconnecting members. Yet another conductive structure 86 that embodies teachings of the present invention is shown in FIG. 6. The conductive structure 86 is similar to the conductive structure 84 shown in FIG. 5. As illustrated in FIG. 6, however, the conductive structure 86 may include a first set 88 of electrically conductive traces 36E, 36F, 36G, a second set 90 of electrically conductive traces 36H, 36I, 36J, a first interconnecting member 40, a second interconnecting member 42, and a third interconnecting member 44. The first interconnecting member 40 may be structurally and electrically coupled to an end of the conductive trace 36G and an end of the conductive trace 36H, the second interconnecting member 42 may be structurally and electrically coupled to an end of the conductive trace 36F and an end of the conductive trace 36I, and the third interconnecting member 44 may be structurally and electrically coupled to an end of the conductive trace 36E and an end of the conductive trace 36J. In other embodiments, the conductive structure 86 may include any number of conductive traces and corresponding interconnecting members as desired.

Figure 7:
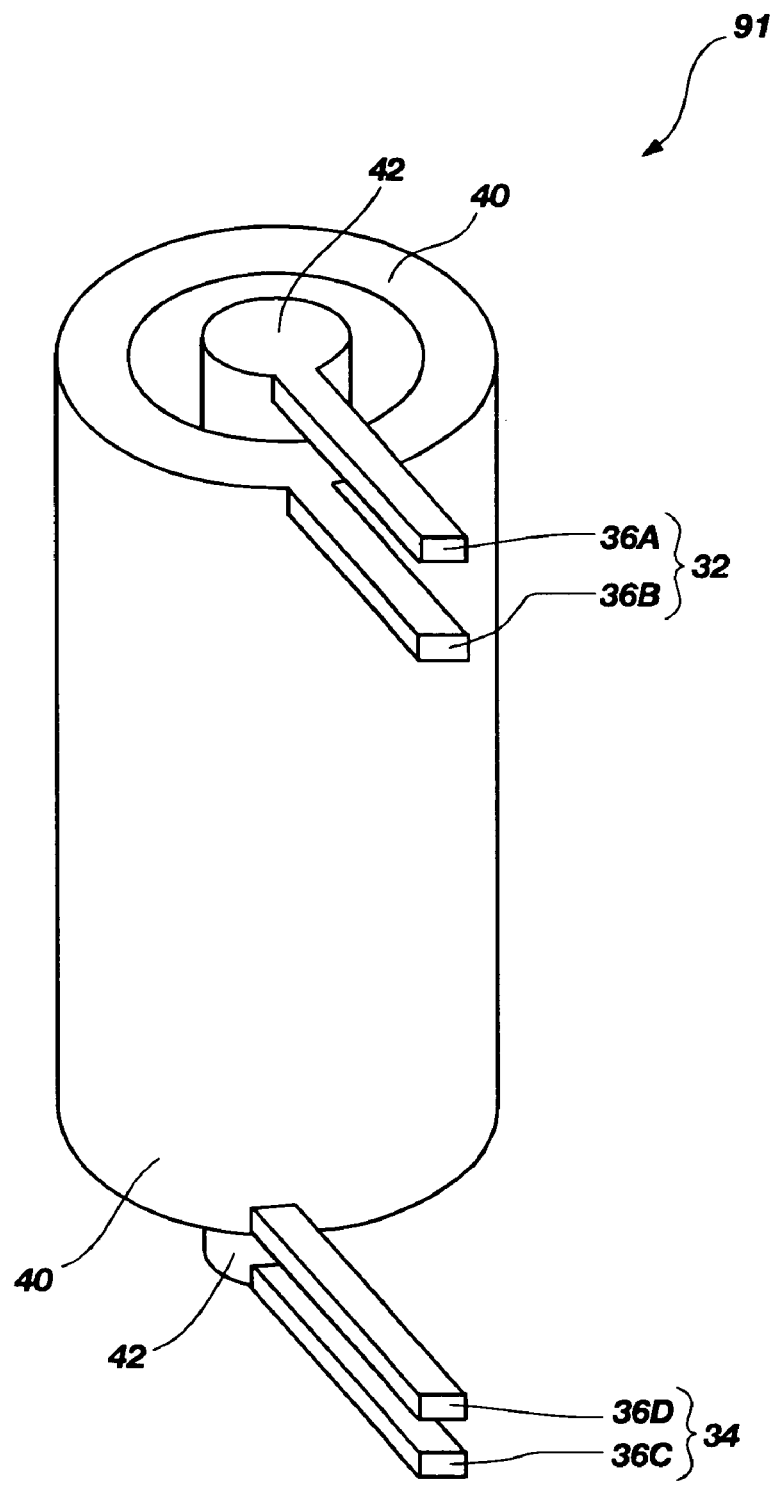
FIG. 7 is a perspective view of still another illustrative conductive structure that embodies teachings of the present invention.

Another illustrative conductive structure 91 that embodies teachings of the present invention is shown in FIG. 7. The conductive structure 91 is substantially similar to the conductive structure 30 shown in FIG. 2. In the conductive structure 91, however, the first conductive trace 36A of the first pair 32 is disposed vertically above the second conductive trace 36B of the first pair 32, as opposed to the horizontally side-by-side configuration shown in FIG. 2. In a similar manner, the first conductive trace 36C of the second pair 34 is disposed vertically below the second conductive trace 36D of the second pair 34. A dielectric material (not shown) may be disposed between the conductive traces 36A, 36B of the first pair 32 and the conductive traces 36C, 36D of the second pair 34 when the conductive structure 91 is disposed in a substrate (not shown) as previously described.

Figure 8:
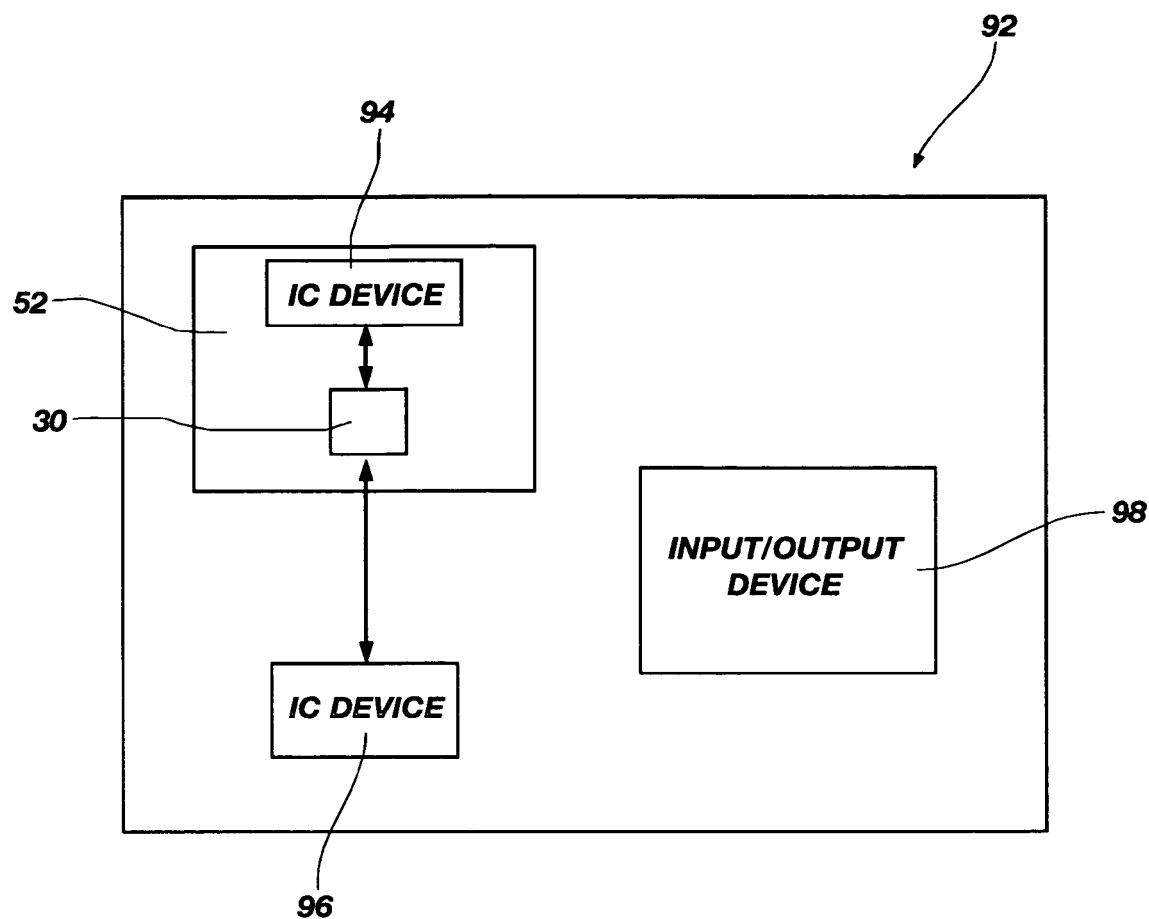
FIG. 8 is a block diagram of an illustrative electronic system that embodies teachings of the present invention.

A block diagram of an illustrative electronic system 92 that embodies teachings of the present invention is shown in FIG. 8. The electronic system 92 includes a substrate 52 (such as, for example, a circuit board) comprising an electrically conductive structure that embodies. teachings of the present invention such as, for example, the conductive structure 30 shown in FIG. 2. The system 92 further includes at least one electrical component 94 attached to the substrate 52, and at least one additional electrical component 96. In one particular embodiment, the electrical component 94 and the electrical component 96 may each include an integrated circuit device, as shown in FIG. 8. For example, the electrical component 94 may include a memory device, and the electrical component 96 may include an electronic signal processor device (often referred to as a "microprocessor").

In other embodiments, the electrical component 94 may include an integrated circuit device such as a memory device or an electronic signal processor device, and the electrical component 96 may include, for example, an electronic signal controller device. Moreover, both the electrical component 94 and the electrical component 96 may be attached to the substrate 52.

The electronic system 96 may, optionally, further include one or more input/output devices 98 such as, for example, a mouse or other pointing device, keyboard, control panel, monitor, printer, etc., which may communicate electrically with at least one of the electrical component 94 and the electrical component 96.

With reference to FIGS. 2 and 8 together, the electrical component 94 may be electrically coupled to the conductive traces 36A, 36B of the first pair 32, and the electrical component 96 may be electrically coupled to the conductive traces 36C, 36D of the second pair 34. In this configuration, electrical communication may be enabled and established between the electrical component 94 and the electrical component 96 through the conductive trace 36A, the second interconnecting member 42, and the conductive trace 36C, and through conductive trace 36B, the first interconnecting member 40, and the conductive trace 36D. In this configuration, the electrical component 94 and the electrical component 96 may be configured to electrically communicate with one another through the conductive structure 30 using differential signaling techniques. At least one of the electrical component 94 and the electrical component 96 may be configured to provide a differential signal between the conductive traces 36A, 36B of the first pair 32, between the first interconnecting member 40 and the second interconnecting member 42, and between the conductive traces 36C, 36D of the second pair 34. In certain embodiments, at least one of the electrical component 94 and the electrical component 96 may be configured to provide a voltage difference of less than about three volts between the conductive traces 36A, 36B of the first pair 32, between the first interconnecting member 40 and the second interconnecting member 42, and between the conductive traces 36C, 36D of the second pair 34.

In other embodiments, at least one of the electrical component 94 and the electrical component 96 may be configured to provide an electrical signal through the conductive trace 36A of the first pair 32, the second interconnecting member 42, and the conductive trace 36C of the second pair 34, and the conductive trace 36B of the first pair 32, the first interconnecting member 40, and the conductive trace 36D of the second pair 34 then may be used as a controlled impedance line to shield the conductive trace 36A, the second interconnecting member 42, and the conductive trace 36C from electromagnetic interference. Similarly, at least one of the electrical component 94 and the electrical component 96 may be configured to provide an electrical signal through the conductive trace 36B of the first pair 32, the first interconnecting member 40, and the conductive trace 36D of the second pair 34, and the conductive trace 36A of the first pair 32, the second interconnecting member 42, and the conductive trace 36C of the second pair 34 then may be used as a controlled impendence line to shield the conductive trace 36B, the first interconnecting member 40, and the conductive trace 36D from electromagnetic interference.

The teachings of the present invention may provide conductive vias, structures, and other features that maintain a constant distance between corresponding or complementary conductive paths or traces as they extend from one plane in a substrate to another plane in the substrate. Furthermore, the teachings of the present invention may be used to minimize the amount of area or "real estate" on a substrate required for conductive vias that extend from one plane in a substrate to another plane in the substrate.

While the present invention has been described in terms of certain illustrated embodiments and variations thereof, it will be understood and appreciated by those of ordinary skill in the art that the invention is not so limited. Rather, additions, deletions and modifications to the illustrated embodiments may be effected without departing from the spirit and scope of the invention as defined by the claims which follow.

What is claimed is:

1. An electronic device comprising:
   an at least substantially planar substrate having at least one hole extending therethrough;
   a first pair of electrically conductive traces, the first pair of electrically conductive traces extending at least substantially parallel to one another on or in the substrate;
   a second pair of electrically conductive traces, the second pair of electrically conductive traces extending at least substantially parallel to one another on or in the substrate;
   an electrically conductive first interconnecting member extending through the at least one hole and electrically communicating with an end of a first trace of the first pair and an end of a first trace of the second pair; and
   an electrically conductive second interconnecting member extending through the at least one hole and electrically communicating with an end of a second trace of the first pair and an end of a second trace of the second pair, the first interconnecting member being separated from the second interconnecting member by a distance that is at least substantially equal to a distance separating the electrically conductive traces of the first pair and a distance separating the electrically conductive traces of the second pair, wherein at least a portion of the second interconnecting member completely surrounds the first interconnecting member.

2. The electronic device of claim 1, wherein the first pair of electrically conductive traces extend at least substantially parallel to one another in a first plane on or in the substrate and the second pair of electrically conductive traces extend at least substantially parallel to one another in a second plane on or in the substrate, the second plane being oriented at least substantially parallel to the first plane and separated therefrom by a distance.

3. The electronic device of claim 1, wherein the distance separating the first interconnecting member from the second interconnecting member is less than about 30 microns.

4. An electronic device comprising:
   an at least substantially planar substrate having at least one hole extending therethrough;
   a first pair of electrically conductive traces, the first pair of electrically conductive traces extending at least substantially parallel to one another on or in the substrate;
   a second pair of electrically conductive traces, the second pair of electrically conductive traces extending at least substantially parallel to one another on or in the substrate;
   an electrically conductive first interconnecting member extending through the at least one hole and electrically communicating with an end of a first trace of the first pair and an end of a first trace of the second pair; and
   an electrically conductive second interconnecting member extending through the at least one hole and electrically communicating with an end of a second trace of the first pair and an end of a second trace of the second pair, the first interconnecting member being separated from the second interconnecting member by a distance that is at least substantially equal to a distance separating the electrically conductive traces of the first pair and a distance separating the electrically conductive traces of the second pair;

wherein the first interconnecting member has a hollow at least substantially cylindrical shape having an inner diameter, and wherein the second interconnecting member has an at least substantially cylindrical shape having an outer diameter, the second interconnecting member being disposed within the first interconnecting member.

5. The electronic device of claim 1, further comprising a dielectric material disposed between the first interconnecting member and the second interconnecting member.

6. The electronic device of claim 5, further comprising an additional dielectric material disposed between the conductive traces of the first pair and the conductive traces of the second pair, the additional dielectric material exhibiting a dielectric constant that is greater than a dielectric constant exhibited by the dielectric material disposed between the first interconnecting member and the second interconnecting member.

7. The electronic device of claim 5, wherein the dielectric material exhibits a dielectric constant that provides a capacitance between the first interconnecting member and the second interconnecting member that at least substantially matches a capacitance between the electrically conductive traces of the first pair and a capacitance between the electrically conductive traces of the second pair.

8. The electronic device of claim 4, wherein the distance separating the first interconnecting member from the second interconnecting member is less than about 30 microns.

9. The electronic device of claim 4, further comprising a dielectric material disposed between the first interconnecting member and the second interconnecting member.

10. The electronic device of claim 9, wherein the dielectric material comprises a polymer material.

11. The electronic device of claim 9, further comprising an additional dielectric material disposed between the conductive traces of the first pair and the conductive traces of the second pair, the additional dielectric material exhibiting a dielectric constant that is greater than a dielectric constant exhibited by the dielectric material disposed between the first interconnecting member and the second interconnecting member.

12. The electronic device of claim 9, wherein the dielectric material exhibits a dielectric constant that provides a capacitance between the first interconnecting member and the second interconnecting member that at least substantially matches a capacitance between the electrically conductive traces of the first pair and a capacitance between the electrically conductive traces of the second pair.

13. The electronic device of claim 4, wherein the first pair of electrically conductive traces extend at least substantially parallel to one another in a first plane on or in the substrate and the second pair of electrically conductive traces extend at least substantially parallel to one another in a second plane on or in the substrate, the second plane being oriented at least substantially parallel to the first plane and separated therefrom by a distance.

14. A method of fabricating an electronic device assembly, the method comprising:
providing an at least substantially planar substrate having at least one hole extending therethrough;
forming at least a first pair of electrically conductive traces extending at least substantially parallel to one another on or in the substrate and a second pair of electrically conductive traces extending at least substantially parallel to one another on or in the substrate;
forming an electrically conductive first interconnecting member extending through the at least one hole and electrically communicating with an end of a first trace of the first pair and an end of a first trace of the second pair;
forming an electrically conductive second interconnecting member extending through the at least one hole and electrically communicating with an end of a second trace of the first pair and an end of a second trace of the second pair, the first interconnecting member being separated from the second interconnecting member by a distance that is at least substantially equal to a distance separating the electrically conductive traces of the first pair and a distance separating the electrically conductive traces of the second pair; and
forming at least a portion of the second interconnecting member to completely surround the first interconnecting member.

15. The method of claim 14, wherein providing an at least substantially planar substrate having at least one hole extending therethrough comprises:
providing an at least substantially planar substrate; and
forming the at least one hole through the substrate.

16. The method of claim 15, wherein forming the at least one hole through the substrate comprises forming at least one at least substantially cylindrical hole through the substrate.

17. The method of claim 14, wherein forming an electrically conductive first interconnecting member comprises depositing a layer of conductive material on exposed surfaces of the substrate within the at least one hole.

18. The method of claim 17, further comprising providing a layer of dielectric material on exposed surfaces of the layer of conductive material within the at least one hole.

19. The method of claim 18, wherein forming an electrically conductive second interconnecting member comprises depositing conductive material on exposed surfaces of the layer of dielectric material within the at least one hole.

20. The method of claim 19, further comprising:
removing a first portion of the first interconnecting member adjacent a first major surface of the substrate to create a first void; and
removing a second portion of the first interconnecting member adjacent a second major surface of the substrate to create a second void.

21. The method of claim 20, wherein forming at least a first pair of electrically conductive traces extending at least substantially parallel to one another on or in the substrate and a second pair of electrically conductive traces extending at least substantially parallel to one another on or in the substrate comprises:
forming at least a first pair of electrically conductive traces on a first major surface of the substrate, a conductive trace of the first pair of electrically conductive traces extending through the first void to an end of the second interconnecting member adjacent the first major surface; and
forming at least a second pair of electrically conductive traces on a second major surface of the substrate, a conductive trace of the second pair of electrically conductive traces extending through the second void to an end of the second interconnecting member adjacent the second major surface.

22. The method of claim 14, further comprising:
providing a transmitting device configured to apply a differential signal between the conductive traces of the first pair, between the first interconnecting member and the second interconnecting member, and between the conductive traces of the second pair;

providing a receiving device configured to receive the differential signal applied by the transmitting device; and establishing electrical communication between the transmitting device and the receiving device through the conductive traces of the first pair, the first interconnecting member and the second interconnecting member, and the conductive traces of the second pair.

23. A method of designing an electrical device assembly comprising a transmitting device configured to transmit a differential signal to a receiving device, the method comprising:

providing a substrate having at least one hole extending at least partially therethrough;

selecting a conductive path extending from a first location disposed in a plane on or in the substrate to a second location disposed in a second plane on or in the substrate, a first segment of the conductive path extending through the at least one hole;

configuring a first pair or electrically conductive traces to extend at least substantially parallel to one another along a second portion of the conductive path from the first location to the at least one hole and a second pair of electrically conductive traces to extend at least substantially parallel to one another along a third portion of the conductive path from the second location to the at least one hole, the conductive traces of the first pair being separated from one another by a distance, the conductive traces of the second pair being separated from one another by the distance;

configuring a conductive first interconnecting member to extend through the at least one hole and communicate electrically with an end of a first trace of the first pair and an end of a first trace of the second pair;

configuring a conductive second interconnecting member to extend through the at least one hole and communicate electrically with an end of a second trace of the first pair and an end of a second trace of the second pair, the first interconnecting member being separated from the second interconnecting member by a distance that is at least substantially equal to the distance separating the conductive traces of the first pair from one another and the conductive traces of the second pair from one another; and forming at least a portion of the second interconnecting member to completely surround the first interconnecting member.

24. The method of claim 23, wherein configuring a conductive first interconnecting member comprises configuring the first interconnecting member to have an at least substantially cylindrical shape having an outer diameter, and wherein configuring a conductive second interconnecting member comprises configuring the second interconnecting member to have a hollow at least substantially cylindrical shape having an inner diameter, the first interconnecting member being disposed within the second interconnecting member, the distance between the outer diameter of the first interconnecting member and the inner diameter of the second interconnecting member being at least substantially equal to the distance separating the electrically conductive traces of the first pair and the distance separating the electrically conductive traces of the second pair.

25. The method of claim 24, wherein the distance separating the first interconnecting member from the second interconnecting member is configured to be less than about 30 microns.

26. The method of claim 23, further comprising selecting a dielectric material to be disposed between the first interconnecting member and the second interconnecting member.

27. The method of claim 26, wherein selecting a dielectric material comprises selecting a dielectric material that exhibits a dielectric constant that provides a capacitance between the first interconnecting member and the second interconnecting member at least substantially equal to a capacitance between the electrically conductive traces of the first pair and a capacitance between the electrically conductive traces of the second pair.

28. The method of claim 23, further comprising configuring a transmitting device to communicate electrically with a receiving device through the conductive traces of the first pair, the first interconnecting member, the second interconnecting member, and the conductive traces of the second pair.

* * * * *